April 20, 1971 B. T. MURPHY 3,575,741

METHOD FOR PRODUCING SEMICONDUCTOR INTEGRATED CIRCUIT DEVICE AND PRODUCT PRODUCED THEREBY

Filed Feb. 5, 1968

INVENTOR
B. T. MURPHY
BY
A.W. Lockhart
ATTORNEY

United States Patent Office 3,575,741
Patented Apr. 20, 1971

3,575,741

METHOD FOR PRODUCING SEMICONDUCTOR INTEGRATED CIRCUIT DEVICE AND PRODUCT PRODUCED THEREBY

Bernard T. Murphy, New Providence, N.J., assignor to Bell Telephone Laboratories, Incorporated, Murray Hill, N.J.

Filed Feb. 5, 1968, Ser. No. 703,164
Int. Cl. H01l 7/64
U.S. Cl. 148—175 9 Claims

ABSTRACT OF THE DISCLOSURE

In the fabrication of a junction-isolated semiconductor integrated circuit structure, a plurality of N-type buried layers are diffused into a P-type substrate, and a thin P-type epitaxial layer is grown thereover. N-type deep contact zones are diffused completely through the epitaxial layer to intersect separate ones of the N-type buried layers, thus defining base areas. P-type impurities are then diffused non-selectively into the entire surface of the P-type epitaxial layer to form a graded impurity profile for the base zone. N-type emitter zones are then diffused selectively into the surface.

BACKGROUND OF THE INVENTION

(1) Field of the invention

This invention relates to semiconductor devices and, more particularly, to structures suitable for junction-isolated semiconductor integrated circuits.

In the art of semiconductor integrated circuitry, the functions of a plurality of active and/or passive electronic elements such as transistors, diodes, resistors, and capacitors are provided upon or within a unitary body of semiconductor material. Fundamental to this art is the necessity to provide some form of electrical isolation between certain of the functional electronic elements.

Among a variety of electrical isolating arrangements, the presently most widely accepted technique uses a pair of back-to-back junction diodes between the functional elements to be isolated. These pairs of diodes are disposed so that at least one of the junctions is reverse biased at any given time, thus providing a high impedance path between the functional elements.

(2) Description of the prior art

Junction-isolated semiconductor integrated circuits of the prior art are disclosed in Pat. 3,260,902 to E. H. Porter.

In general, such structures comprise an original P-type substrate which may or may not have N-type buried layers diffused into the surface thereof. An N-type epitaxial layer is formed on the entire surface of the substrate, and P-type isolation zones are diffused entirely through the epitaxial layer to intersect the P-type substrate. These P-type isolation zones, in conjunction with the substrate, create islands of N-type material completely surrounded by regions of P-type material. These N-type islands are thus, to a considerable degree, electrically isolated from each other in that after the operating voltages are applied an electrical charge of either polarity must pass through at least one reverse-biased P–N junction in order to travel from one N-type island to another.

For applications in whiuh it is desired to provide, within a particular N-type island, a transistor having minimum collector series resistance, the next step is the formation, within that N-type island, of highly doped, narrow N-type zones which extend completely through the epitaxial layer, i.e., from the surface thereof to the N-type buried zone beneath. These highly doped N-type zones, termed "deep contact zones" herein, reduce the resistance encountered by charge carriers traveling between an N-type buried zone and the electrical content at the surface of the epitaxial layer.

To complete an integrated circuit, then, the additional functional zones (base zones, emitter zones, resistor zones, etc.) are formed selectively by standard diffusion, photolithographic, and oxide masking techniques. Electrical contacts and interconnections are formed as required.

As the trend in integrated circuits tends constantly toward an increasing number of functional elements per device, one must achieve parallel improvements in product yield for the trend to retain economic feasibility. Significant increases in yield may result from a reduction in the number of fabrication steps alone. Also, it is well known that yield is strongly dependent on element area, i.e., with all other factors being equal, there will be a higher yield of physically smaller device than of a larger device.

SUMMARY OF THE INVENTION

In accordance with this invention, a junction-isolated integrated circuit device structure is disclosed in which the area required per functional element is significantly reduced and in the fabrication of which a number of steps are eliminated, as compared to the prior art.

A further important advantage of this invention is that transistors having higher values of inverse gain than conveniently available in the prior art can be fabricated hereby.

In a particular embodiment of this invention, a junction-isolated semiconductor integrated circuit device comprises a substrate of a first conductivity type having a first major surface into which a first pattern of zones of a second conductivity type are formed. An epitaxial layer of first conductivity type covers the first major surface and thereby buries the first pattern of zones.

Within the epitaxial layer, and extending to the surface thereof, a second pattern of zones of second conductivity type intersect, and thus contact electrically, the entire perimeter of each of the buried zones. Zones of this second pattern will be termed "deep contact zones."

It will be appreciated that this described structure comprises isolated islands of epitaxial material of first conductivity type within which electrically isolated functional elements may subsequently be formed. For example, a buried zone may be used as the collector of a transistor and, at the same time, as part of the isolation structure of the same transistor. Alternatively, a buried zone may be a portion of the isolation structure of a resistor.

Proceeding further with this structure, a layer of first conductivity type is diffused non-selectively into the entire surface of the epitaxial layer to form a graded profile of impurity concentration therein. In some of the isolated islands mentioned hereinabove, the diffused layer may be used as a part of a base zone of a transistor. In other isolated islands, the diffused layer may become part of a resistor zone.

In the final diffusion step, zones of second conductivity type are formed selectively within the isolated islands by photolithographic and oxide masking techniques. These last diffused zones may form transistor emitters, or they may be disposed so as to trim the value of resistors.

In one aspect, an important feature of this invention is the provision of a thin epitaxial layer having the same conductivity type as the substrate, thereby obviating the isolation diffusion step. Deep contact zones are diffused completely through the thin epitaxial layer to intersect the entire perimeter of the buried layer collectors. These deep contact zones provide a low resistance electrical path between the buried zones and the surface and also provide a portion of the junction isolation between functional elements.

Furthermore, these deep contact zones also serve to define the lateral extent of base zones and resistor zones, thereby obviating the need for a selective base diffusion with its associated photolithographic masking operation.

BRIEF DESCRIPTION OF THE DRAWING

This invention will be more clearly understood from the following detailed description taken in conjunction with the drawing in which.

DETAILED DESCRIPTION

Figure 1:
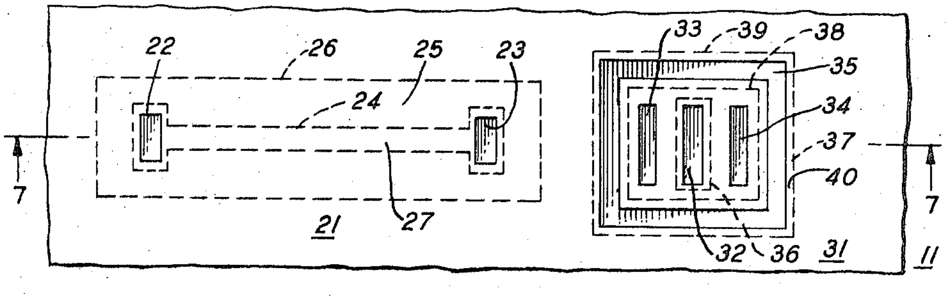
FIG. 1 is a plan view of a portion of a semiconductor integrated circuit wafer showing a resistor and a transistor.

FIG. 1 depicts schematically a plan view of a typical resistor 21 and a typical transistor 31 within a portion 11 of a semiconductor wafer fabricated according to the first embodiment set forth hereinbelow. Solid-line patterns shown therein depict contact windows formed through the oxide layer by standard photolithographic and oxide masking techniques.

As shown in FIG. 1, the resistance zone 27 is defined by broken line 24. The region 25 outside the pattern formed by broken line 24 and inside the rectangular pattern formed by broken line 26 exemplifies an isolation region surrounding resistance zone 27.

Transistor 31 in FIG. 1 comprises a rectangular emitter zone defined by broken line 36; a rectangular base zone defined by broken line 38; and a collector zone 40 defined on the outside by broken line 39 and on the inside by broken line 38. Pattern 32 is the emitter contact; patterns 33 and 34 are base contacts; and pattern 35 is the collector contact.

Figure 2:
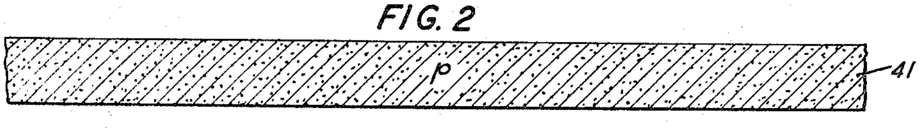
FIGS. 2–7 are cross-sectional views of the same wafer portion substantially as it appears following successive fabrication steps leading to formation of the contact structure. It will be noted that the oxide coatings have been omitted, for clarity, in all but FIG. 7.

Referring to FIG. 2, for a first described embodiment, the fabrication begins with a monocrystalline silicon wafer 41 which may be a portion of a slice of P-type conductivity produced by boron doping to have a substantially uniform resistivity of about 5 ohm-centimeters. This portion 41 typically may have a thickness of about five to ten mils and may be suitably prepared for subsequent processing by mechanical lapping and polishing or by chemical milling, all well known in the art.

Figure 3:
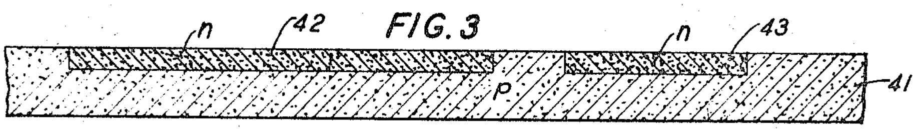

The next step in the fabrication of the junction-isolated integrated circuit structure is illustrated in FIG. 3, wherein zones 42 and 43 of relatively low resistivity N-type conductivity are formed in the P-type substrate wafer. Zones 42 and 43 are typically formed by solid-state diffusion and are confined substantially to the rectilinear-shaped zones as shown in FIG. 3 by well-known photolithographic and oxide masking techniques. A slow-diffusing impurity such as antimony or arsenic, or a relatively faster diffusing impurity such as phosphorous may be diffused to form these zones. The selection of the impurity to be employed depends on considerations of outdiffusion and desired impurity profile, both more fully discussed hereinbelow. These N-type zones typically are diffused to a surface concentration of about $10^{20}$ atoms per cubic centimeter or greater and to a depth of about one to two microns.

Figure 4:
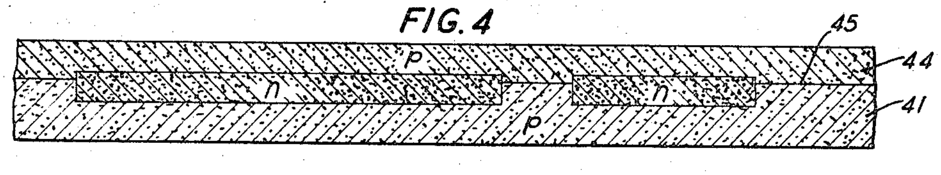

As indicated in FIG. 4, a P-type epitaxial layer 44 is formed on the face of the P-type substrate by processes well known in the art. To achieve high frequency devices, epitaxial layer 44 will typically be less than about two microns thick, and in this specific example, is about one micron and is doped with boron to provide a substantially uniform resistivity of about 0.3 ohm-centimeter. It will be noted that, by definition, a 0.3 ohm-centimeter layer which is one micron thick has a sheet resistivity of about 3000 ohms per square.

Since the epitaxial growth process involves a substantial heat treatment, some outdiffusion of zones 42 and 43 into epitaxial layer 44 will occur. In contradistinction to the prior art, this outdiffusion is usually desirable for the structures disclosed herein, inasmuch as this outdiffusion causes the collector-base junction formed between layer 44 and zone 43 to move outward away from the layer-substrate interface 45 where certain crystal lattice imperfections inevitably result. In addition, this outdiffusion tends to produce a collector region wherein the ionized impurity concentration increases away from the collector-base junction. This situation is usually desirable in that it tends to optimize the usually conflicting requirements of maximizing junction breakdown voltage and minimizing junction capacitance for a minimum collector series resistance.

The extent of this outdiffusion may be controlled by selecting either slow or fast diffusing impurities for the buried zones 42 and 43. In a specific example, antimony was used and an outdiffusion of about 0.25 micron into the one micron epitaxial layer was observed.

Figure 5:
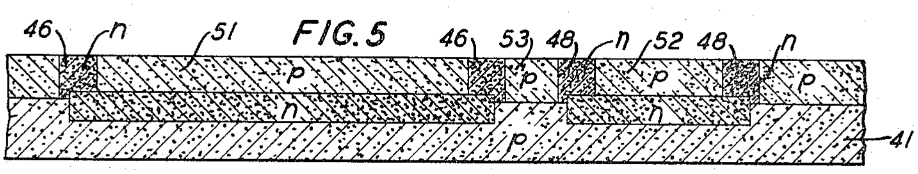

As shown in FIG. 5, deep contact zone 46 (sectional view of zone 25 in FIG. 1), and zone 48 (sectional view of zone 40 in FIG. 1), are diffused completely through the epitaxial layer 44 to intersect the entire peripheral portions of buried layer zones 42 and 43. Typically, these deep contact zones will be of relatively low resistivity N-type, and in this specific example, surface concentrations of about $10^{20}$ atoms per cubic centimeter or greater were typically obtained.

With reference to FIGS. 1 and 5, it will be appreciated that the deep contact zones in conjunction with the buried zones completely enclose, and thus electrically isolate, islands 51 and 52 of P-type epitaxial material.

It will be noted that in the photolithographic steps associated with this deep contact diffusion, precise registration of the deep contact patterns with preceding patterns is not essential. With respect to product yield, this relaxed tolerance is a further advantage of this invention.

Figure 6:
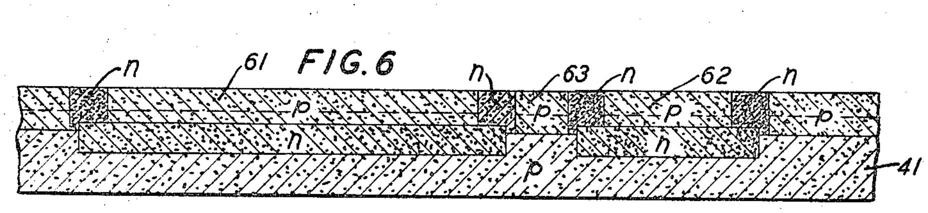

The next step, as shown in FIG. 6, involves diffusing P-type impurities non-selectively into the entire surface of epitaxial layer 44. The concentration of these impurities is advantageously adjusted to be low enough so that the N-type deep contact zones are not converted to P-type, but high enough to form in all other portions of layer 44, P-type zones having an impurity profile such that the concentration of ionized impurity atoms decreases inward from the surface.

For this specific embodiment, the initial level of impurities in epitaxial layer 44, 0.3 ohm-centimeters and one micron thick, is about $10^{17}$ per cubic centimeter. Surface concentration of these diffused P-type zones 61, 62, and 63, diffused to a final depth of about 0.5 micron, is about $10^{19}$ atoms per cubic centimeter.

The impurity concentrations set forth hereinabove produce, in zones 61, 62, and 63, an effective surface sheet resistivity of about 500 ohms per square. It will be noted that this is substantially less than the initial sheet resistivity (3000 ohms per square) of the epitaxial layer. For this reason, it may be desirable to do a selective P-type base diffusion which avoids zones, such as zone 61, which will ultimately become resistors. This process is described more fully hereinbelow.

Figure 7:
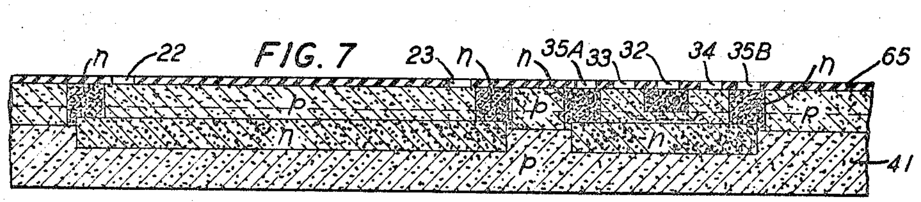

As shown in FIG. 7, a final diffusion step forms the relatively low resistivity N-type emitter zone 36. This relatively shallow N-type emitter diffusion may be done at the same temperature used for the N-type deep contact zones, described hereinabove, but is of shorter duration. In a specific embodiment, emitter zones were diffused to a depth of about 0.5 micron with a surface concentration of at least $10^{20}$ per cubic centimeter.

Since this N-type emitter diffusion is a selective process, one can, with but slight increase in complexity, again diffuse N-type impurities into the deep contact zones to offset the effect of the non-selective P-type diffusion into these areas. Exercising this option will be advantageous where minimum collector series resistance is a goal, as in low power dissipation, non-saturating logic circuits, and also where minimum collector-base junction capacitance and maximum collector-base breakdown voltage is desired.

FIG. 7 also shows oxide coating 65 on the semiconductor body. As shown in FIGS. 1 and 7, patterns 22 and 23 are the contacts of resistor 21. Pattern 32 is the emitter contact; patterns 33 and 34 are the base contacts; and patterns 35, 35A, and 35B represent the ring-type collector contact of transistor 31.

Referring back to FIG. 1, it will be appreciated that resistor 21 consists of a layer of P-type epitaxial material 61 surrounded and defined by buried layer 42 and deep contact zone 25 and is effectively terminated electrically by contact windows 22 and 23. Also shown in FIG. 1 is transistor 31 having emitter contact 32, two base contacts 33 and 34, and a ring-type collector contact 35.

It will be apparent that a variety of arrangements may be adopted for accomplishing actual electrical contact to the contact windows and for accomplishing the interconnection of integrated arrays of functional elements. A particularly advantageous technique includes the use of a beam lead technology such as disclosed in M. P. Lepselter Pat. 3,335,338.

A second embodiment of the invention may also be described with reference to the drawing. This embodiment is substantially the same as the first embodiment described hereinabove except that herein P-type impurities are selectively diffused into P-type epitaxial layer 44. That is, with the addition of a photolithographic step, diffusion of P-type impurities into zones which will ultimately become resistors is avoided, thus retaining the high initial sheet resistivity of epitaxial layer 44 and thus allowing the fabrication of physically smaller resistors. However, in considering this approach, one must recognize the well-known principle that, with respect to thermal coefficient of resistance, resistors formed in higher resistivity semiconductor material will tend to be inferior to resistors formed in the lower resistivity diffused layers.

A third embodiment may also be described with reference to the drawing. This third embodiment differs from the first embodiment only in that herein no P-type diffusion into the epitaxial layer is done. This eliminates one diffusion step at the expense of some deleterious effect on certain transistor characteristics (particularly gain and frequency response) in devices made thereby.

Several factors should be considered in deciding whether to use the P-type diffusion into the P-type epitaxial layer. First, the P-type diffusion produces a higher concentration of P-type impurities adjacent the side-walls of an emitter than adjacent the bottom of the emitter. This tends to suppress minority carrier injection through the emitter side-walls. Since minority carriers injected through the emitter side-walls have little chance of being collected by the collector, this suppression should enhance emitter injection efficiency and thus enhance transistor gain.

Secondly, the diffused impurity profile produces a built-in electric field in the base zone in such a direction to oppose minority carrier movement toward the surface. This effect tends to significantly decrease minority carrier recombination at the surface and also tends to reduce the effective volume available for minority carrier storage within the base zone. Also, for a transistor operating in the inverse mode, the effect of this built-in field tends to cause a build-up of minority carriers in those parts of the base zone away from the emitter zone. This build-up tends to decrease minority carrier injection from all except that part of the base-collector junction which is immediately opposite the emitter-base junction, since the emitter-base junction acts as a sink for the injected minority carriers. This effect tends to increase the inverse gain of transistors made in this fashion.

Although the invention has been described in terms of certain specific embodiments, it will be understood that other arrangements may be devised by those skilled in the art which likewise fall within the scope and spirit of the invention.

For example, methods for forming diodes, capacitors, and field-effect transistors have not been discussed because methods for forming these and other functional elements will be apparent from the foregoing description.

Similarly, the use of N-type material for the substrate and epitaxial layer with corresponding substitution of P-type for the second conductivity type to form PNP bipolar transistors and complementary structures will also be apparent.

What is claimed:

1. A method of fabricating a semiconductor integrated circuit device including only a single type of junction transistor comprising the steps of forming, into the surface of a body of semiconductive material of a first conductivity type, a first pattern comprising a plurality of zones of a second conductivity type, depositing an epitaxial layer of semiconductive material of the first conductivity type over the surface of the body;

forming into the epitaxial layer, a second pattern of zones of the second conductivity type, each zone of the second pattern intersecting the entire perimeter of separate ones of the zones of the first pattern; and introducing non-selectively into substantially the entire surface of the epitaxial layer dopant impurities of a type and concentration sufficient to form zones of first conductivity type having a graded impurity concentration which decreases inward from the surface, the concentration of the non-selectively introduced impurities being insufficient to invert the conductivity-type of the zones of the second pattern.

2. The method according to claim 1 wherein said epitaxial layer is of P-type conductivity.

3. The method according to claim 1 wherein said epitaxial layer is less than two microns thick.

4. The method according to claim 1 wherein said epitaxial layer is about one micron thick.

5. A method of fabricating a semiconductive device as recited in claim 1 further comprising the step of forming into the surface of the epitaxial layer a third pattern comprising a plurality of spaced zones of the second conductivity type, each of the zones of the third pattern being disposed over a zone of the first pattern.

6. A method as recited in claim 5 wherein the recited impurity-introducing steps are the only substantial impurity-introducing steps employed in the process.

7. A semiconductor integrated circuit device fabricated according to claim 5 wherein at least one of said zones of said first pattern constitutes a collector of, and at least a portion of the electrical isolation for, a transistor, the corresponding zone of the second pattern of zones delimits the lateral extent of the base zone of said transistor, and constitutes a low resistance electrical contact and at least a portion of the electrical isolation for said transistor, the corresponding one of said third pattern of zones constitutes an emitter zone for said transistor, and the corresponding one of the graded impurity concentration zones non-selectively formed into said epitaxial layer constitutes a portion of the base zone of said transistor.

8. A semiconductor integrated circuit device fabricated according to claim 1 wherein at least one of said zones of said first pattern underlies and constitutes at least a portion of the electrical isolation for a resistor, and the corresponding one of the zones of the second pattern defines the lateral geometry of and constitutes at least a portion of the electrical isolation for said resistor.

9. A semiconductor integrated circuit device fabricated according to claim 8 wherein at least a portion of one of said zones of said third pattern further delimits the lateral extent of the resistor.

References Cited

UNITED STATES PATENTS

| | | | |
|---|---|---|---|
| 3,260,902 | 7/1966 | Porter | 148—175UX |
| 3,387,193 | 6/1968 | Donald | 148—187X |
| 3,410,735 | 12/1968 | Hackley | 148—175X |
| 3,449,643 | 6/1969 | Imaizumi | 148—175X |
| 3,430,110 | 2/1969 | Goshgarian | 148—175UX |
| 3,443,176 | 5/1969 | Agusta | 148—175X |
| 3,474,308 | 10/1969 | Kronlage | 148—176X |

OTHER REFERENCES

Pieczonka, W. A.: Light Activated Semiconductor Switch, in IBM Technical Disclosure Bulletin, vol. 7, No. 7, December 1964, pp. 618, 619.

ALLEN B. CURTIS, Primary Examiner

U.S. Cl. X.R.

148—187; 317—235